United States Patent [19]

Kawai et al.

[11] 4,430,683
[45] Feb. 7, 1984

[54] GROUND FAULT DETECTING DEVICE FOR USE WITH A DC CIRCUIT

[75] Inventors: Tadao Kawai; Tomoharu Nakamura, both of Hitachi, Japan

[73] Assignee: Hitachi, Ltd., Tokyo, Japan

[21] Appl. No.: 351,766

[22] Filed: Feb. 24, 1982

[30] Foreign Application Priority Data

Feb. 27, 1981 [JP] Japan ................................ 56-27001

[51] Int. Cl.³ .......................................... H02H 3/16
[52] U.S. Cl. ...................................... 361/42; 361/49
[58] Field of Search ............... 361/42, 49, 50; 324/51; 340/650

[56] References Cited

U.S. PATENT DOCUMENTS 3,609,534  9/1971  Gurevich .......................... 361/42 X

FOREIGN PATENT DOCUMENTS 52-46459  4/1977  Japan ...................................... 361/42

Primary Examiner—Harry E. Moose, Jr.
Attorney, Agent, or Firm—Antonelli, Terry & Wands

[57] ABSTRACT

A ground detecting device for detecting a ground fault in a DC circuit, through which a DC power produced by converting a poly-phase AC power by an AC-DC converter is transmitted and which is connected at an earth point to the earth, is arranged to detect an earth current flowing through the earth point and extract a DC component, if any, from the detected earth current and to judge whether a ground fault has occurred or not by comparing the level of the DC component with a predetermined reference level.

7 Claims, 10 Drawing Figures

GROUND FAULT DETECTING DEVICE FOR USE WITH A DC CIRCUIT

The present invention relates to a ground fault detecting device for use with a DC circuit, and more particularly to a ground fault detecting device for use with a DC circuit through which a DC power obtained by conversion of a poly-phase AC power by an AC-DC converter is transmitted to a load.

One of such DC circuits is a DC power transmission system in which a poly-phase AC power is converted through an AC-DC converter into a DC power, which is applied to a load. One of two wire constituting the DC circuit is connected to the earth and a ground relay is usually provided for ground fault detection by monitoring the earth current flowing through the earth point. Normally, no current flows into the ground relay and thus it is not actuated. In the event that a ground fault takes place, however, a fault current flows through the ground fault point and the earth point, then actuating the ground relay.

In designing the DC circuit, much care is taken so as to avoid an erroneous operation of the ground relay due to a current flowing into the ground relay by way of a so-called detour circuit. The DC circuit generally has a stray capacitance, which may form such a detour circuit so that a leakage current flowing therethrough may cause such an erroneous operation. In order to avoid this erroneous operation, the ground relay has hitherto been arranged to actuate when the ground current is detected to be sufficiently large. This measure is very effective to avoid the erroneous operation caused by a usual leakage current due to the stray capacitance.

It has been found, however, that there is another leakage current which may appear when the poly-phase AC current is converted through an AC-DC converter into a DC current. Since this leakage current is sometimes very large, the above measure can not give a satisfactory solution to the leakage current problem.

Accordingly, an object of the present invention is to provide a ground fault detecting device for use with a DC circuit, which can prevent an erroneous operation which may be caused by a leakage current produced when the poly-phase AC current is converted through an AC-DC converter into a DC current. The leakage current includes a harmonic component of the DC current generated when the AC phase-voltages are unbalanced. In the present invention the harmonic component is removed from the earth current flowing through the earth point and the remaining component is used for detection of a ground fault.

The present invention will be explained in detail with reference to the accompanying drawings in which:

FIG. 1 schematically illustrates an arrangement of a direct current transmission system;

Figure 1:
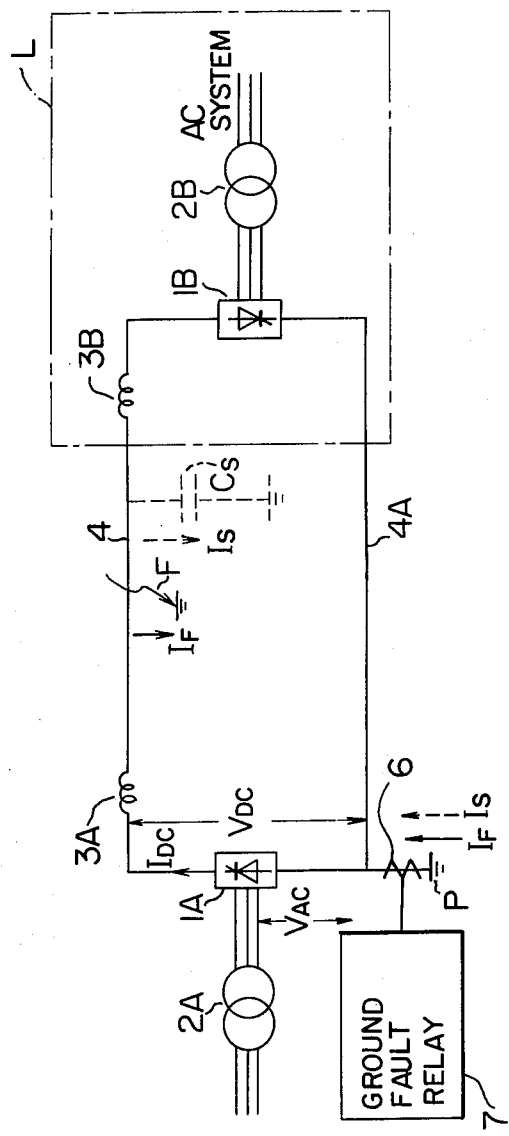

FIG. 1 illustrates an arrangement of a DC power transmission system which may be influenced by a stray capacitance. A DC power transmission system is connected between two AC power transmission systems, through transformers 2A and 2B. The DC power transmission system includes AC-DC converters 1A and 1B, smoothing reactors 3A and 3B, and a DC power transmission line including a neutral line 4A. A DC current transformer (DCCT) 6 and a ground fault relay 7 are provided at an earth point P of the DC power transmission system. When a ground fault takes place at F, a ground current $I_f$ flows into the DCCT 6 through the earth point P. The DC transformer 6 detects the ground current and the ground fault detecting relay 7 judges whether or not the ground current reaches the level generally produced by a ground fault. When it reaches the fault level, it judges that a ground fault takes place. In other words, it judges that a ground fault takes place, when the current flowing through the route including the ground fault point and the earth point exceeds the fault level.

In the figure, the smoothing reactor 3B, the AC-DC converter 1B operating in an inverter mode and the transformer 2B correspond to a load L. A leakage current Is flows into the ground relay 7 through a stray capacitor Cs.

The erroneous operation of the relay 7 caused by the current Is will be described.

Figure 2A:
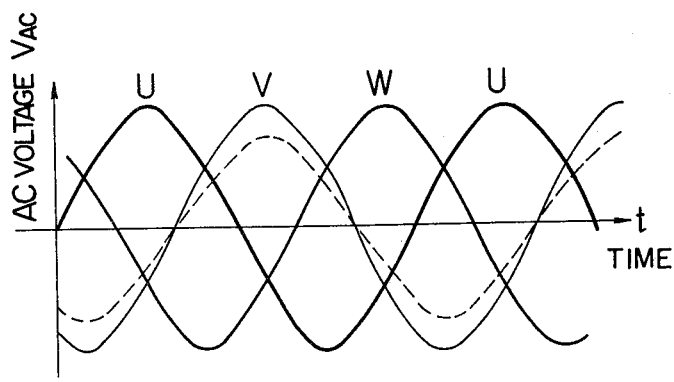
FIGS. 2a, 2b and 2c illustrates waveforms of AC phase voltages, DC voltage and DC current, respectively, in the AC-DC converter operating as a rectifier.
Figure 2B:
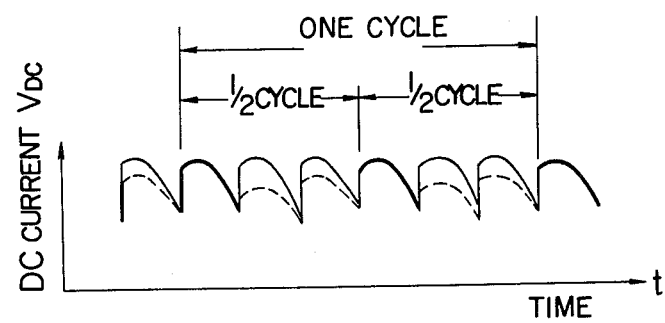
Figure 2C:
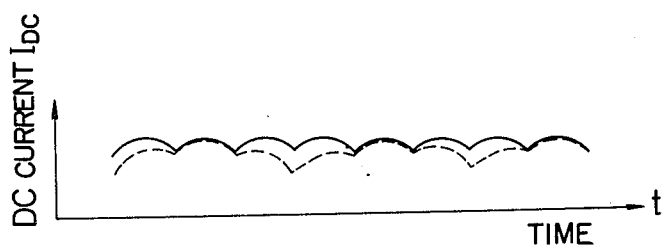

FIGS. 2a, 2b and 2c illustrate waveforms of an AC voltage $V_{AC}$, a DC voltage $V_{DC}$ and a DC current $I_{DC}$ respectively, of the AC-DC converter 1A operating in a rectifying mode. In the figures, the abscissa t represents time. These waveforms illustrate, by way of example, those in the case of full-wave rectification of an AC voltage of three phases of U, V and W. In the figures, solid lines indicate the waveforms of $V_{AC}$, $V_{DC}$ and $I_{DC}$ appearing when the three phase-voltages are balanced. Dot lines indicate the waveforms appearing when only the V-phase voltage is reduced, as an example where the phase voltages are unbalanced. As seen from FIG. 2c, the DC Current $I_{DC}$ includes a DC component of constant level and a ripple component which is the sixth harmonics of the basic AC component when the phase voltages are balanced, but includes an additional component having a frequency two times the frequency of the basic AC component when the phase voltages are unbalanced. Thus, the additional component corresponds to the second harmonics of the basic AC component. In the above example, a voltage drop in one of the three phases, by way of example, was discussed. Similarly, there appear additional harmonics other than the riple component of sixth harmonics due to unbalance of phase voltages in any poly-phase AC system other than the threephase AC system.

The ripple current of sixth harmonics and the harmonics due to unbalance of phase-voltages flow, as a leakage current, into the ground relay 7 through the stray capacitance Cs. An amount of the ripple current can previously be calculated on the basis of the firing phase angle of the AC-DC converter, and is generally very small such as 10% or less of the rated value of $I_{DC}$. Therefore, the erroneous operation due to the ripple current may easily be avoided by adjusting an operating threshold of the ground relay. An amplitude of the higher harmonics due to the unbalance of phase-voltages changes depending on the degree of the imbalance, and it is sometimes much larger than that of the ripple current. The worst condition of the voltage imbalance occurs when one of the three phases is open, resulting in several tens % or more % of the rated value of $I_{DC}$ flowing as Is. It might be possible to adjust the operating threshold or sensitivity of the ground relay to such a value as to prevent the ground relay from erroneously operating, by previously calculating an amplitude of the harmonics in the worst unbalanced condition. According to this approach, however, there would be a great possibility that the relay can not discriminate the ground fault from the imbalance of phase-voltages resulting in failure of correctly detecting the ground fault. Therefore, this approach is not effective to prevent the ground relay from erroneous operation.

The voltage unbalanced condition resulting in erroneous operation sometimes occurs from an excitation rush current when the transformer in the AC system is made active. The AC system with an insufficient transportation of transmission lines is likely to fall in the voltage unbalanced condition. Therefore, in the ground detecting device for the DC circuit, it is desired to provided a measure for preventing the ground detecting device from erroneously operation even when the harmonics appear due to the AC voltage unbalanced condition.

Figure 3:
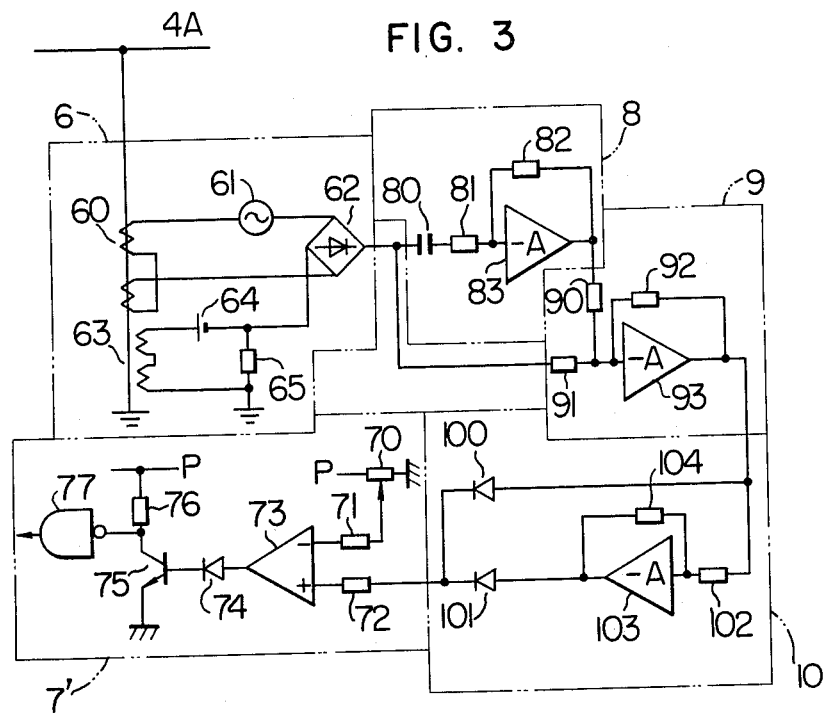
FIG. 3 is a circuit diagram of an embodiment of a ground fault detecting circuit according to the present invention.

The device of the present invention is arranged to detect the ground fault from the detected earth current subtracted by an AC component thereof. An embodiment of the present invention is shown in FIG. 3. In FIG. 3, reference numeral 6 designates a DC current transformer (DCCT); 8 a differential circuit; 9 an adder; 10 a full-wave rectifier circuit; and 7' a judging circuit. Of those circuits, the DCCT 6 and the judging circuit 7' are similar to those used in the prior device, while the circuits 8 to 10 are additionally used according to the present invention.

In FIG. 3, the DCCT 6 includes a detection coil 60, an exciting power source 61, a rectifier bridge 62, a bias coil 63, a bias power source 16, and a resistor 65. This arrangement constitutes a so-called polarity DCCT capable of detecting also both polarities of currents. That is, it can detect both DC and AC.

The differential circuit 8 includes a capacitor 80 for differentiation, a resistor 81, an inverting amplifier 80, and a feedback resistor 82. The differential circuit 8 extracts an AC component from the output signal from the DCCT 6 and produces an inversion of the AC component. The adder 9 including resistors 90 to 92 and an inverting amplifier 93 adds the output signal from the DCCT 6 and the output of the differential circuit 8, i.e. an inversion of the AC component to produce an inverted output signal. The inverted output signal corresponds to the DC component obtained by subtracting the AC component from the output signal of the DCCT 6.

The full-wave rectifier circuit 10, made up of diodes 100 and 101, resistors 102 and 104, and an inverting amplifier 103, is used to detect the absolute value of the DC component in the output of the adder 9.

The judging circuit 7' includes resistors 70 to 72, and 76, a comparator 73, a diode 74, a transistor 75, and an inverting gate 77. The output signal from the full-rectifier circuit 10 is compared with a predetermined reference level preset by a potentiometer 70 by a comparator 73. When the output of the rectifier 10 is larger than the reference level, the output of the comparator is applied through the diode 74 to the transistor 77 thereby to render it conductive and the inverting gate 77 produces an output signal of "1". The level of "1" indicates the presence of ground fault.

Figure 4C:
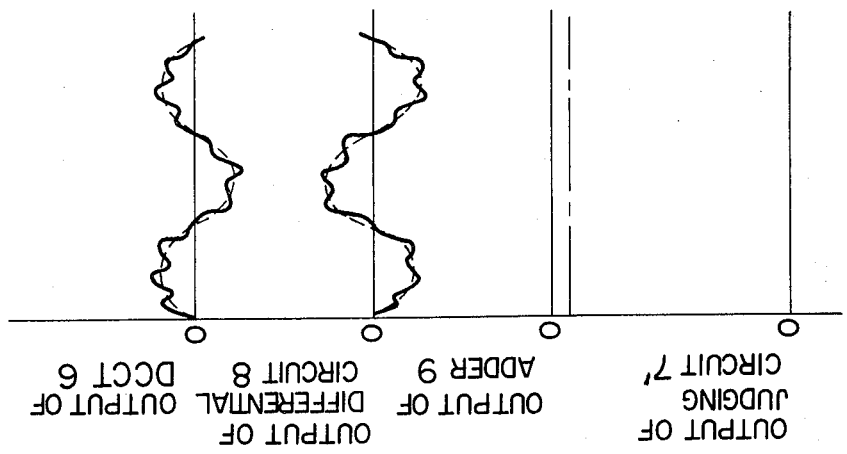
FIGS. 4a, 4b and 4c illustrates waveforms at various points of the circuit of FIG. 3 at normal state, at occurrence of ground fault, and at occurrence of imbalance of AC phase-voltages, respectively, and FIGS. 5 and 6 schematically illustrate other embodiments of the present invention.
Figure 4B:
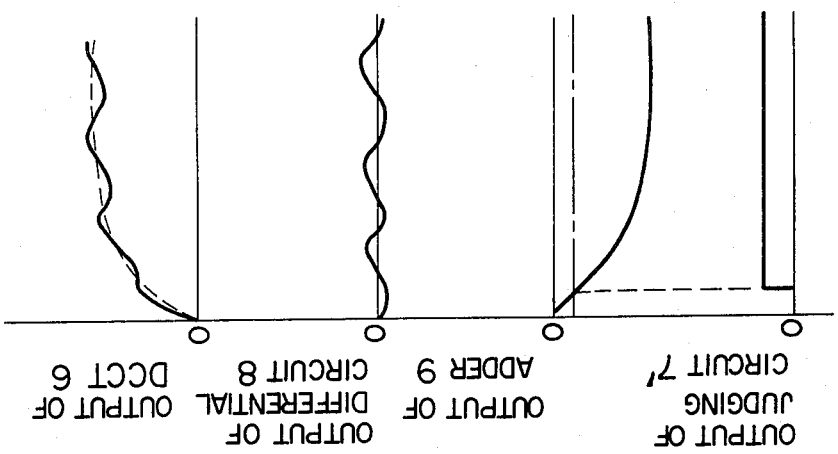
Figure 4A:
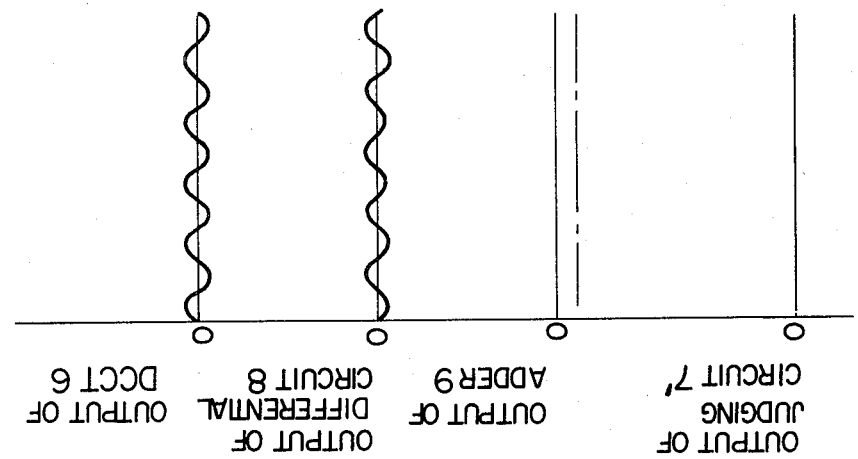

How the erroneous operation of the ground relay is prevented by the circuit arrangement shown in FIG. 3, will now be described referring to FIGS. 4a, 4b and 4c which lllustrate waveforms of signals at various points in the circuit shown in FIG. 3, respectively, under normal operating condition, occurrence of ground fault, and condition of imabalance of phase-voltages.

As seen from the Figures, the current detected by the DCCT 6 is analysed as follows. The current is composed of almost only the ripple component of sixth harmonics under the normal condition. The ripple component is produced when the three-phase AC current is rectified. The current detected under occurrence of ground fault includes a large portion of the fault current $I_F$ and a small portion of the leakage current Is. The detected current includes an oscillating current as well as the DC component. Only a leakage current Is flows when the AC phase-voltages are unbalanced and it is a mixture of the 2nd and 6th harmonics in the example of FIG. 2. It is understood, therefore, that the DC component is detected only when the ground fault occurs as shown in FIG. 4b. The detected signal is applied to the differential circuit 8 where the DC component is removed, and only an AC component is inputted into the adder 9 through the resistor 90. The AC component is inverted in polarity with respect to the output signal from the rectifying bridge 62. The output signal from the rectifier circuit 62 is applied through the resistor 91 to the adder 9. In the two input signals applied to the adder 9, the AC components are opposite in polarity and hence these AC components cancel each other in the adder. As a result, only the DC component, if any, is produced by the adder 9. In this way, the AC components are removed, so that the output signal from the adder 9 is almost zero at the normal condition as shown in FIG. 4a and at the unbalanced condition of AC phase voltages as shown in FIG. 4c. If the DC output is present, its amplitude is much smaller than the reference level derived from the potentiometer 70 shown by one dot chain lines in FIGS. 4a, 4b and 4c. Therefore, the adder 9 produces an output of substantial level only when the ground fault occurs so that the DC component is contained in the output of the DCCT 6. The DC output signal is applied to the full-wave rectifier 10, whose output is inputted into the comparator 73. When the level of the DC component applied to the comparator 73 is smaller than the reference level derived from the potentiometer 70, the output signal from the comparator 73 is "0" so that the output of the inverting gate 77 is maintained at "0". When the ground fault occurs, the DC component is larger than the reference signal from the potentiometer 70 so that the comparator through the output of the comparator 73 goes "1" and hence the output of the inverting gate 77 is rendered "1", indicative of occurrence of ground fault.

As described above, in the embodiment shown in FIG. 3 the cancellation of the AC component contained in the detected earth current is carried out by extracting the AC component from the detected current and adding an inversion of the extracted AC component to the detected current. For the cancellation of the AC component, any of the following two arrangements shown in FIGS. 5 and 6 may be used.

Figure 5:
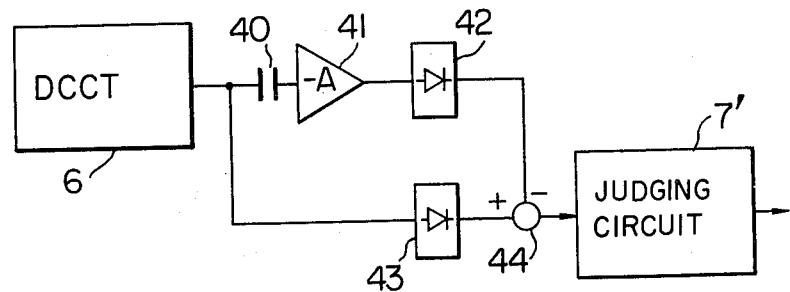

FIG. 5 shows another embodiment of the present invention. The output of the polarized DCCT 6 is branched into two routes, one including a capacitor 40, an inverting amplifier 41 and a rectifier circuit 42, and the other including a rectifier circuit 43. The output signals produced from the two routes are subjected to subtraction and the result is applied to the relay 7'. With this arrangement, the AC component is detected and rectified through a capacitor 40, the inverting amplifier 41 and the rectifier circuit 42. The rectified output signal is subtracted from another rectified signal from the rectifier 43, so that the AC component due to the unbalanced phase-voltages is cancelled. Then, a very small DC component, if any, resulted from the subtraction and the DC component due to ground fault are inputted into the judging circuit 7'. Consequently, the ground fault is correctly detected, as in the embodiment shown in FIG. 3.

Figure 6:
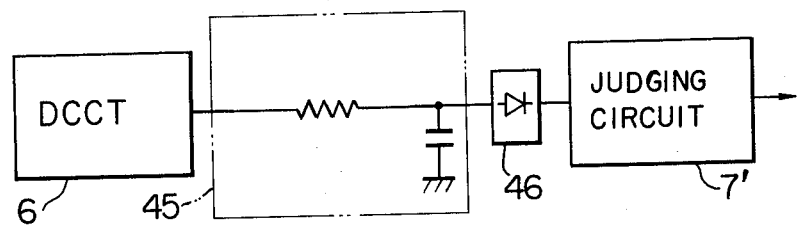

FIG. 6 shows yet another embodiment of the present invention. In this embodiment, a low-pass filter 45 and a rectifier circuit 46 are inserted between the polarized DCCT 6 and the judging circuit 7'. This arrangement can simply extract only the DC component.

As seen from the foregoing description, the ground fault detecting device for use which a DC circuit according to the present invention assures reliable operation even at the presence of the second harmonics due to imbalance of phase-voltages in the AC system. The fault detecting device is highly sensitive to the ground fault, since there is no need for setting the detecting level at unnecessary high level accompanied by the sensitivity reduction.

We claim:

1. A ground detecting device for detecting a ground fault in a DC circuit through which a DC power is obtained by converting an AC power by an AC-DC converter, and which is connected at its earth point to the earth and provided with an earth current detector for detecting an earth current flowing through the earth point, said device comprising DC component detecting means for detecting a DC component contained in the earth current detected by said earth current detector, and judging means for judging a ground fault which has occurred in the DC circuit, said DC component detecting means including a differential circuit for differentiating the earth current, and an adder for producing the DC component on the basis of the output of said differential circuit and said earth current.

2. A ground detecting device for detecting a ground fault in a DC circuit through which a DC power is obtained by converting an AC power by an AC-DC converter, and which is connected at its earth point to the earth and provided with an earth current detector for detecting an earth current flowing through the earth point, said device comprising DC component detecting means for detecting a DC component contained in the earth current detected by said earth current detector, and judging means for judging a ground fault which has occurred in the DC circuit, said DC component detecting means including first means for obtaining an AC component of said earth current and for rectifying said AC component, second means for rectifying said earth current, and an adder circuit for producing the DC component by summing the output signals of said first and second means.

3. A ground detecting device for detecting a ground fault in a DC circuit through which a DC power is obtained by converting an AC power by an AC-DC converter, and which is connected at its earth point to the earth and provided with an earth current detector for detecting an earth current flowing through the earth point, said device comprising DC component detecting means for detecting a DC component contained in the earth current detected by said earth current detector, and judging means for judging a ground fault which has occurred in the DC circuit, said DC component detecting means including a low-pass filter.

4. A ground detecting device for detecting a ground fault in a DC circuit through which a DC power is obtained by converting an AC power by an AC-DC converter, and which is connected through a grounding circuit to the earth, said ground detecting device comprising:

earth current detecting means coupled to said grounding circuit and including a polarity DC current transformer adapted to detect a current and the polarity thereof flowing through said grounding circuit;

means connected to said polarity DC current transformer for detecting a DC component contained in the output of said DC current transformer; and means for judging a ground fault depending on the DC component detecting by said DC component means.

5. The ground fault detecting device according to claim 4, wherein said DC component detecting means includes a differential circuit for differentiating the output of said DC current transformer, and an adder for producing the DC component on the basis of the output of said differential circuit and the output of said DC current transformer.

6. The ground fault detecting device according to claim 4, wherein said DC component detecting means includes first means for obtaining an AC compoment of the output of said DC current transformer and for rectifying said AC component, second means for rectifying the output of said DC current transformer, and an adder circuit for producing the DC component by summing the output signals of said first and second means.

7. The ground fault detecting device according to claim 4, wherein said DC component detecting means includes a low-pass filter.

* * * * *